US009048139B2

(12) United States Patent
Jeon et al.

(10) Patent No.: US 9,048,139 B2
(45) Date of Patent: Jun. 2, 2015

(54) METHOD FOR FABRICATING NON-VOLATILE MEMORY DEVICE

(71) Applicant: SK hynix Inc., Gyeonggi-do (KR)

(72) Inventors: Seok-Min Jeon, Gyeonggi-do (KR); Sun-Kak Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/540,840

(22) Filed: Nov. 13, 2014

(65) Prior Publication Data

US 2015/0072492 A1 Mar. 12, 2015

Related U.S. Application Data

(62) Division of application No. 13/608,341, filed on Sep. 10, 2012, now Pat. No. 8,900,948.

(30) Foreign Application Priority Data

Dec. 29, 2011 (KR) .......................... 10-2011-0146153

(51) Int. Cl.
*H01L 21/336* (2006.01)
*H01L 27/115* (2006.01)
(52) U.S. Cl.
CPC ................ *H01L 27/11582* (2013.01)

(58) Field of Classification Search
USPC .................................................. 438/591, 593
See application file for complete search history.

(56) References Cited

U.S. PATENT DOCUMENTS

2011/0291176 A1* 12/2011 Lee et al. ....................... 257/324
2011/0298037 A1* 12/2011 Choe et al. .................... 257/324

* cited by examiner

*Primary Examiner* — Alexander Ghyka
(74) *Attorney, Agent, or Firm* — IP & T Group LLP

(57) ABSTRACT

A method for fabricating a non-volatile memory device includes alternately stacking a plurality of inter-layer dielectric layers and a plurality of sacrificial layers over a substrate, forming at least a channel hole that exposes the substrate by selectively etching the inter-layer dielectric layers and the sacrificial layers, forming a protective layer on sidewalls of the sacrificial layers that are exposed through the channel hole, sequentially forming a memory layer and a channel layer on the sidewalls of the channel hole, forming slit holes that penetrate through the inter-layer dielectric layers and the sacrificial layers on both sides of the channel hole, removing the sacrificial layers that are exposed through the slit holes, removing the protective layer, and forming gate electrodes in space from which the sacrificial layers and the protective layer are removed.

11 Claims, 9 Drawing Sheets

METHOD FOR FABRICATING NON-VOLATILE MEMORY DEVICE

CROSS-REFERENCE TO RELATED APPLICATIONS

This application is a division of U.S. patent application Ser. No. 13/608,341 filed on Sep. 10, 2012, which claims priority of Korean Patent Application No. 10-2011-0146153, filed on Dec. 29, 2011. The disclosure of each of the foregoing application is incorporated herein by reference in its entirety.

BACKGROUND

1. Field

Exemplary embodiments of the present invention relate to a method for fabricating a non-volatile memory device, and more particularly, to a method for fabricating a three-dimensional non-volatile memory device including a plurality of memory cells that are stacked on a substrate.

2. Description of the Related Art

A non-volatile memory device retains data even though power is turned off. Diverse non-volatile memory devices such as a flash memory device are widely used.

Meanwhile, as a two-dimensional non-volatile memory device where memory cells are disposed in a single layer over a semiconductor substrate reaches the technical limitation in increasing the integration degree thereof, a three-dimensional non-volatile memory device where a plurality of memory cells are formed along the channels protruded vertically from a semiconductor substrate.

The three-dimensional non-volatile memory device may include a memory layer surrounding channels that are stretched in a perpendicular direction to the substrate, and a plurality of inter-layer dielectric layers and a plurality of gate electrode layers that are alternately stacked along the channels. A plurality of inter-layer dielectric layers and sacrificial layers may be alternately stacked and the gate electrode layers may be formed in the space from which the sacrificial layers are removed.

According to conventional technology, the memory layer may be attacked/impacted in the process of removing the sacrificial layer, and a charge blocking layer, a charge storage layer, or a tunnel insulation layer that are included in the memory layer may be damaged, thus deteriorating characteristics and reliability of semiconductor devices.

SUMMARY

Exemplary embodiments of the present invention are directed to a method for fabricating a non-volatile memory device which is capable of protecting a memory layer from being damaged in a process of removing a sacrificial layer to provide space where gate electrode layers are to be formed, and preventing an occurrence of a back-tunneling phenomenon of electrons to thereby improve characteristics of a charge blocking layer included in the memory layer.

In accordance with an exemplary embodiment of the present invention, a method for fabricating a non-volatile memory device includes alternately stacking a plurality of inter-layer dielectric layers and a plurality of sacrificial layers over a substrate, forming at least a channel hole that exposes the substrate by selectively etching the inter-layer dielectric layers and the sacrificial layers, forming a protective layer on sidewalls of the sacrificial layers that are exposed through the channel hole, sequentially forming a memory layer and a channel layer on the sidewalls of the channel hole, forming slit holes that penetrate through the inter-layer dielectric layers and the sacrificial layers on both sides of the channel hole, removing the sacrificial layers that are exposed through the slit holes, removing the protective layer, and forming gate electrodes in space from which the sacrificial layers and the protective layer are removed.

In accordance with another exemplary embodiment of the present invention, a method for fabricating a non-volatile memory device includes forming a pass gate electrode layer surrounding a sacrificial layer pattern on a substrate, alternately stacking a plurality of inter-layer dielectric layers and a plurality of sacrificial layers over the pass gate electrode layer, forming at least a pair of channel holes that exposes the sacrificial layer pattern by selectively etching the inter-layer dielectric layers, the sacrificial layers, and the pass gate electrode layer, removing the sacrificial layer pattern to form at least a sub-channel hole coupling the pair of the channel holes, forming a protective layer on sidewalls of the sacrificial layers that are exposed through the channel holes, sequentially forming a memory layer and a channel layer on the internal walls of the channel holes and the sub-channel hole, forming slit holes that penetrate through the inter-layer dielectric layers and the sacrificial layers on the both sides of the channel holes, removing the sacrificial layers that are exposed through the slit holes, removing the protective layer, and forming gate electrodes in space from which the sacrificial layers and the protective layer are removed.

DETAILED DESCRIPTION

Figure 1A:
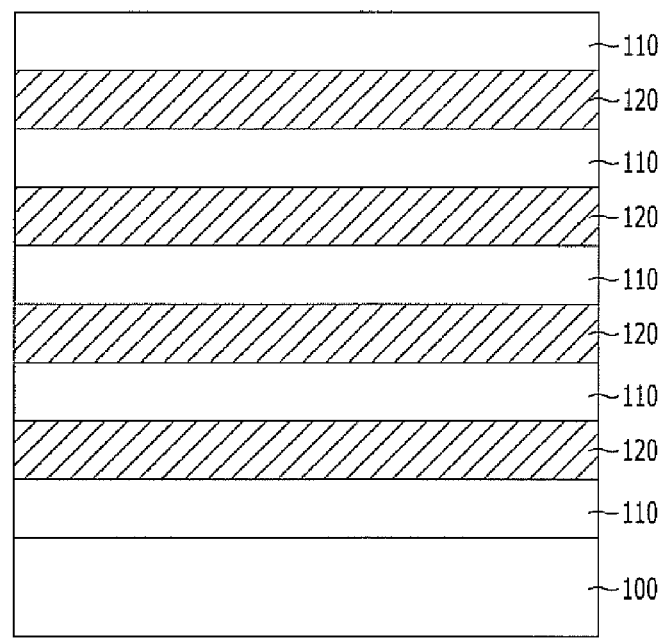
FIGS. 1A to 1F are cross-sectional views illustrating a method for fabricating a non-volatile memory device in accordance with a first exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 1A to 1F are cross-sectional views illustrating a method for fabricating a non-volatile memory device in accordance with a first exemplary embodiment of the present invention.

Referring to FIG. 1A, a plurality of inter-layer dielectric layers 110 and a plurality of sacrificial layers 120 are alternately stacked over a substrate 100 having a given understructure (not shown).

The substrate 100 may be a semiconductor substrate such as a monocrystalline silicon substrate, and the inter-layer dielectric layers 110 may be formed of an oxide-based material.

The sacrificial layers 120 are removed in a subsequent process and serve as molds for providing space where gate electrodes, which are described later on, are to be formed. The sacrificial layers 120 may be formed of a material having an etch selectivity from the inter-layer dielectric layers 110. For example, the sacrificial layers 120 may be formed of a nitride-based material. Although FIG. 1A shows four sacrificial layers 120, this is an illustrative example only, and the number of the sacrificial layers 120 may be more or less than 4.

Figure 1B:
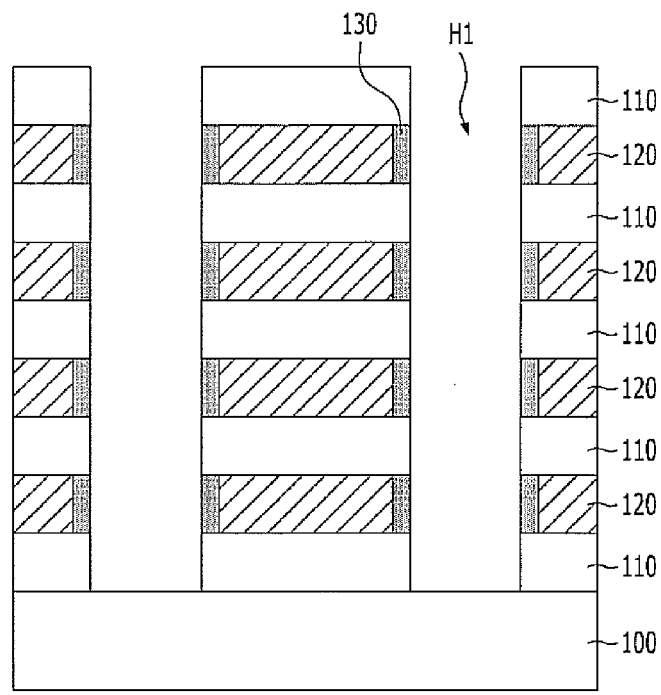

Referring to FIG. 1B, channel holes H1 are formed to expose the substrate 100 by selectively etching the inter-layer dielectric layers 110 and the sacrificial layers 120. The channel holes H1 may have a round or oval shape, and the channel holes H1 may be arrayed in a form of matrix.

Subsequently, a protective layer 130 is formed on the sidewalls of the sacrificial layers 120 that are exposed through the channel holes H1. Here, a portion of each sacrificial layer 120 exposed through the channel holes H1 may be removed and the protective layer 130 may be formed in the space from which the portions of the sacrificial layers 120 are removed in order to prevent bumps from being formed on the sidewalls of the channel holes H1 due to the formation of the protective layer 130.

The protective layer 130 protects a memory layer, which is to be formed later, from being damaged in a subsequent process for removing the sacrificial layers 120. To be specific, the protective layer 130 protects the memory layer from being damaged by phosphoric acid ($H_3PO_4$) that is used to remove the sacrificial layers 120, which are nitride layers.

Therefore, the protective layer 130 may be formed of a material having an etch selectivity from the sacrificial layers 120 for phosphoric acid ($H_3PO_4$). For example, the protective layer 130 may be formed of polysilicon. In particular, since polysilicon has a property that its seeds are formed better on a nitride layer than on an oxide layer, the protective layer 130 may be formed by selectively depositing polysilicon on the sidewalls of the sacrificial layers 120, which are nitride layers. To be more specific, a minute amount of polysilicon seeds may be formed on the sidewalls of the inter-layer dielectric layers 110, which are oxide layers, and the polysilicon seeds may be continuously removed with the use of hydrogen chloride (HCL). However, since the speed of forming the polysilicon seeds on the sacrificial layer 120 is faster than the speed of removing the polysilicon seeds are removed therefrom, the polysilicon may be deposited only on the sidewalls of the sacrificial layers 120, which are nitride layers.

Figure 1C:
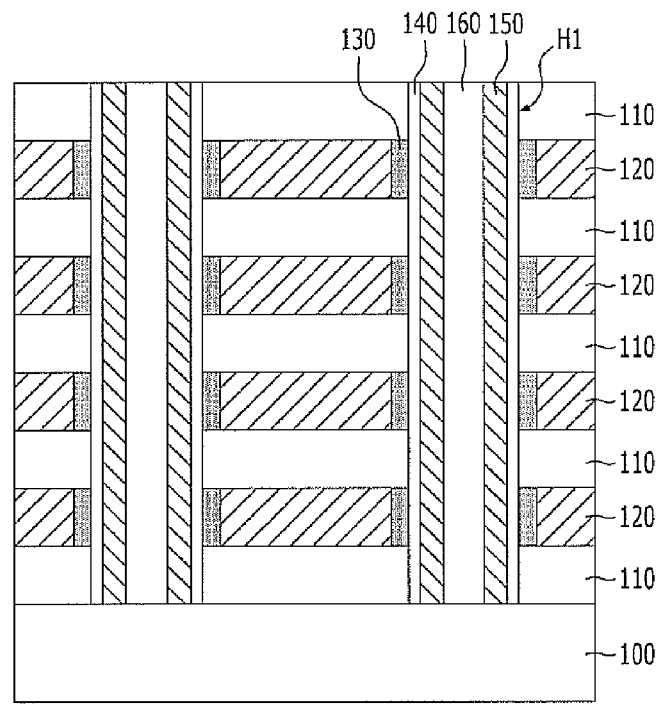

Referring to FIG. 1C, a memory layer 140 and a channel layer 150 are sequentially formed on the sidewalls of the channel holes H1.

The memory layer 140 may be formed by sequentially depositing a charge blocking layer, a charge storage layer, and a tunnel insulation layer. Here, the tunnel insulation layer is used for tunneling of charges, and it may be an oxide layer. The charge storage layer stores data by trapping charges, and it may be a nitride layer. The charge blocking layer prevents the charges inside the charge storage layer from transferring to the outside, and it may be an oxide layer. In short, the memory layer 140 may have a triple-layer structure of oxide-nitride-oxide (ONO).

The channel layer 150 may be formed of a semiconductor material, such as polysilicon. Meanwhile, in the exemplary embodiment, the channel layer 150 may be formed thin so that the channel layer 150 does not completely fill the channel holes H1, but the scope of the present invention is not limited to it. According to another embodiment, the channel layer 150 may be formed to completely fill the channel holes H1.

Subsequently, the vacant space of the channel holes H1 is filled with an insulation layer 160. The insulation layer 160 may be formed of an oxide-based material or a nitride-based material.

Figure 1D:
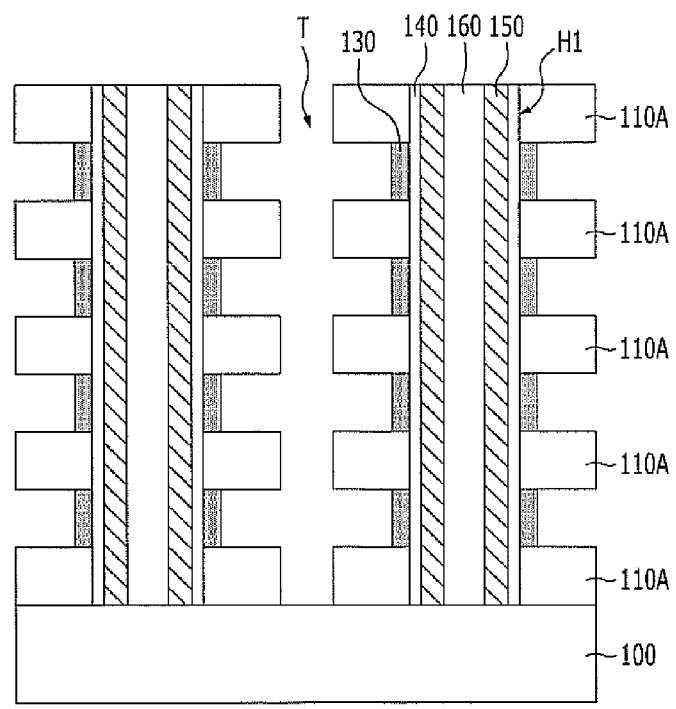

Referring to FIG. 1D, slit holes T penetrating through the inter-layer dielectric layers 110 and the sacrificial layers 120 are formed by selectively etching the inter-layer dielectric layers 110 and the sacrificial layers 120 on both sides of each channel hole H1. The slit holes T may be arrayed in parallel to each other in the form of a slit that is stretched in a direction crossing the cross-sectional direction of the drawing, and the remaining inter-layer dielectric layers 110 are referred to as an inter-layer dielectric layer pattern 110A.

Subsequently, the sacrificial layers 120 exposed through the slit holes T are removed. The sacrificial layers 120 may be removed through a wet etch process using phosphoric acid ($H_3PO_4$). In this process, the protective layer 130 protects the memory layer 140 from being damaged.

Figure 1E:
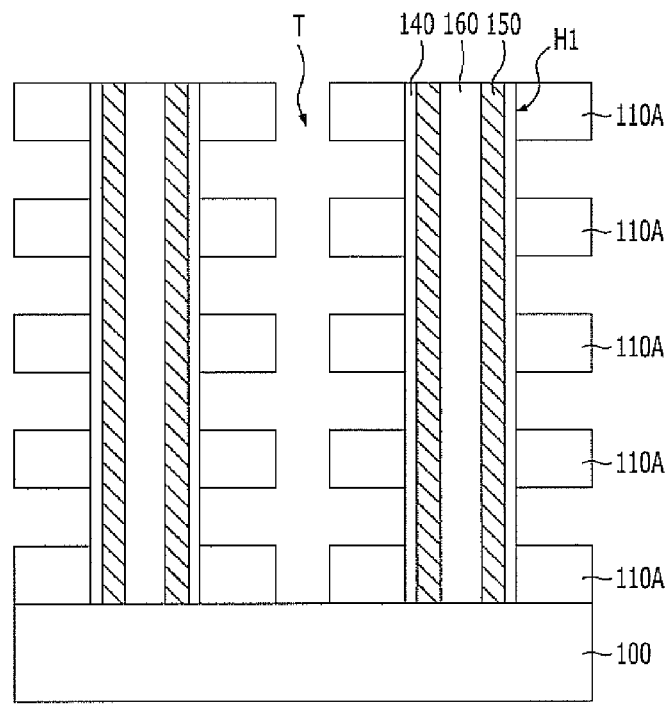

Referring to FIG. 1E, the protective layer 130 surrounding the memory layer 140 is removed. The protective layer 130 may be removed through a stripping process using nitric acid ($HNO_3$).

Subsequently, the charge blocking layer included in the memory layer 140 is densified. To densify the charge blocking layer, oxygen ($O_2$) plasma may be used. As a result of the process, the dangling bond of atoms inside the charge blocking layer are decreased to thereby improve the insulation characteristics of the charge blocking layer, and as a result, a back tunneling phenomenon of electrons may be prevented from occurring.

Meanwhile, although not illustrated in the drawing, another charge blocking layer may be additionally formed by conformally depositing aluminum oxide ($Al_2O_3$) along the internal wall of the space from which the sacrificial layers 120 and the protective layer 130 are removed through the slit holes T.

Figure 1F:
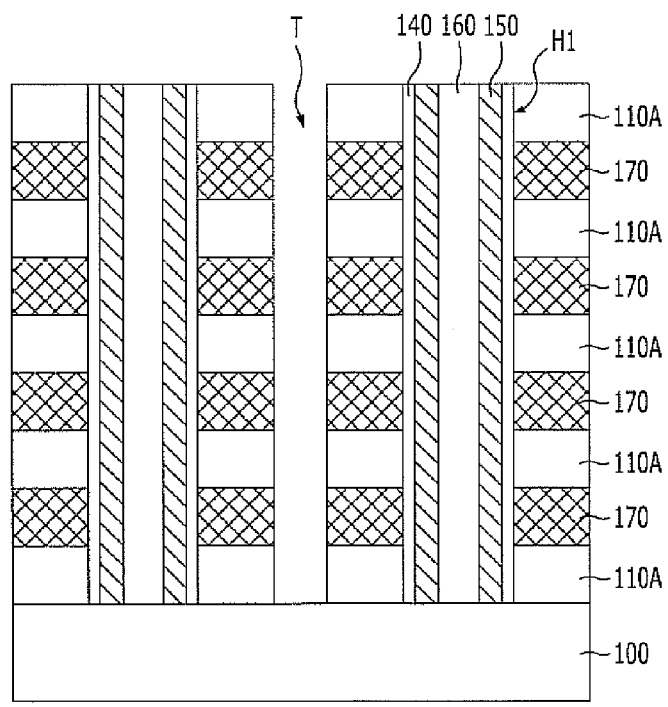

Referring to FIG. 1F, gate electrodes 170 are formed in the space from which the sacrificial layers 120 and the protective layer 130 are removed. The gate electrodes 170 may be formed through the following process.

First of all, a gate electrode-forming conductive layer (not shown) filling the slit holes T including the space from which the sacrificial layers 120 and the protective layer 130 are removed is formed by conformally depositing a conductive material, such as a metal or a metal nitride, through a Chemical Vapor Deposition (CVD) process or an Atomic Layer Deposition (ALD) process.

Subsequently, the gate electrode-forming conductive layer (not shown) is divided into layers by etching the gate electrode-forming conductive layer (not shown) formed in the slit holes T until the sidewalls of the inter-layer dielectric layer pattern 110A are exposed. As a result of this process, the gate electrodes 170 are formed between the inter-layer dielectric layer patterns 110A.

FIGS. 2A to 2G are cross-sectional views illustrating a method for fabricating a non-volatile memory device in accordance with a second embodiment of the present invention. In the description of the second embodiment, detailed description on a portion that is substantially the same as that of the first embodiment is omitted.

Figure 2A:
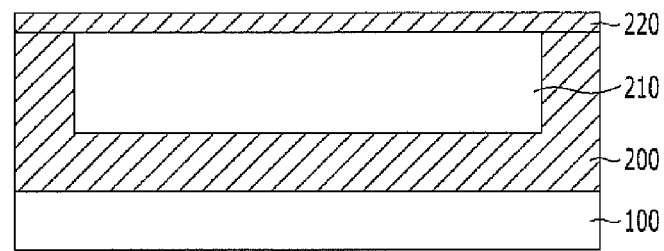
FIGS. 2A to 2G are cross-sectional views illustrating a method for fabricating a non-volatile memory device in accordance with a second exemplary embodiment of the present invention.

Referring to FIG. 2A, a first pass gate electrode layer 200 is formed on a substrate 100. The substrate 100 may be a semiconductor substrate, such as monocrystalline silicon. The first pass gate electrode layer 200 may be formed of a conductive material, such as doped polysilicon or metal.

Subsequently, grooves are formed by selectively etching the first pass gate electrode layer 200, and then a sacrificial layer pattern 210 is formed in the grooves.

The sacrificial layer pattern 210 is removed in a subsequent process and provides space where sub-channels holes are to be formed. The sacrificial layer pattern 210 may be formed of a material having an etch selectivity from inter-layer dielectric layers and sacrificial layers, which are formed later on. Also, the sacrificial layer pattern 210 may be a pattern of ovals arrayed in a form of matrix on a plane and each having a long-axis of the cross-sectional direction shown in the drawing and a short-axis of a direction crossing the cross-sectional direction shown in the drawing.

Subsequently, a second pass gate electrode layer 220 is formed over the first pass gate electrode layer 200 and the sacrificial layer pattern 210. The second pass gate electrode layer 220 may be formed of a conductive material, such as doped polysilicon or metal. The first pass gate electrode layer 200 and the second pass gate electrode layer 220 may surround the sacrificial layer pattern 210 as a gate electrode of a pass transistor.

Figure 2B:
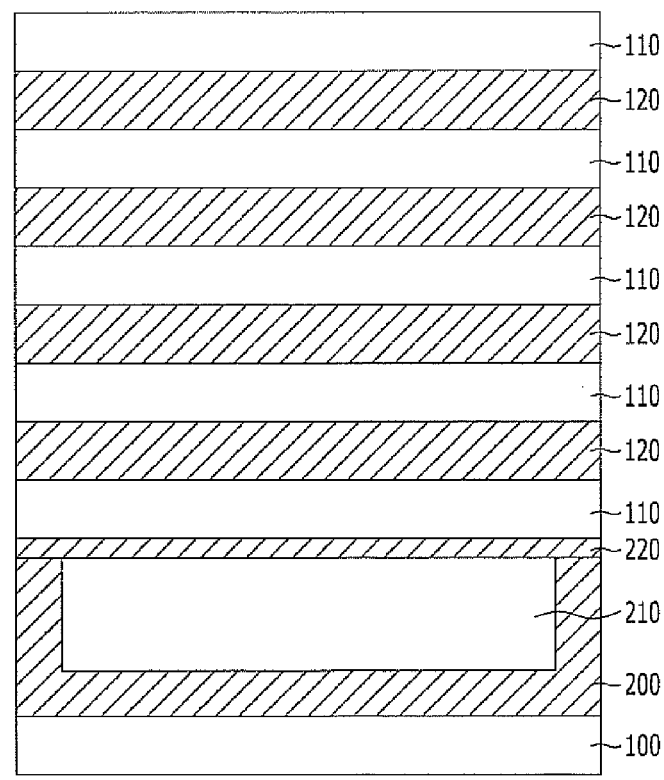

Referring to FIG. 2B, a plurality of inter-layer dielectric layer 110 and a plurality of sacrificial layers 120 are alternately stacked over the second pass gate electrode layer 220.

The inter-layer dielectric layer 110 may be formed of an oxide-based material, and the sacrificial layers 120 are removed in a subsequent process and provide space where gate electrodes are to be formed. The sacrificial layers 120 may be formed of a material having an etch selectivity form the inter-layer dielectric layer 110, such as a nitride-based material.

Figure 2C:
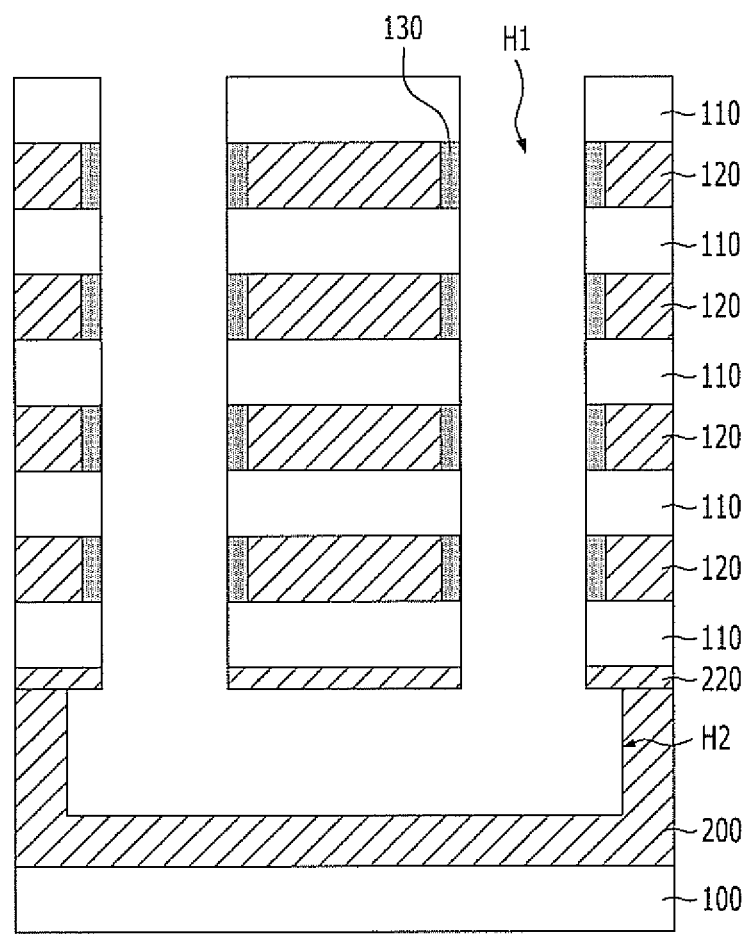

Referring to FIG. 2C, a pair of channel holes H1 exposing the sacrificial layer pattern 210 is formed by selectively etching the inter-layer dielectric layer 110, the sacrificial layers 120, and the second pass gate electrode layer 220. The pair of channel holes H1 is space for forming a channel layer, which is to be formed later, and a pair of channel holes H1 may be disposed for each piece of the sacrificial layer pattern 210.

Subsequently, the sacrificial layer pattern 210 exposed through the pair of channel holes H1 is removed. The sacrificial layer pattern 210 may be removed through a wet etch process based on its etch selectivity from the first pass gate electrode layer 200, the second pass gate electrode layer 220, the inter-layer dielectric layer 110, and the sacrificial layers 120. As a result of this process, sub-channel holes H2 coupling the channel holes H1 of a pair are formed in the space from which the sacrificial layer pattern 210 is removed.

Subsequently, a protective layer 130 is formed on the sidewalls of the sacrificial layers 120 exposed through the channel holes H1. Here, to prevent bumps from being formed on the sidewalls of the channel holes H1 due to the formation of the protective layer 130, a portion of the sacrificial layers 120 that is exposed through the channel holes H1 is removed, and the protective layer 130 may be formed in the space from which a portion of the sacrificial layers 120 is removed.

The protective layer 130 protects a memory layer, which is to be formed later, from being damaged in a subsequent etch process for removing the sacrificial layers 120. The protective layer 130 may be formed of a material having an etch selectivity from the sacrificial layers 120 for phosphoric acid ($H_3PO_4$). For example, the protective layer 130 may be formed of polysilicon.

Figure 2D:
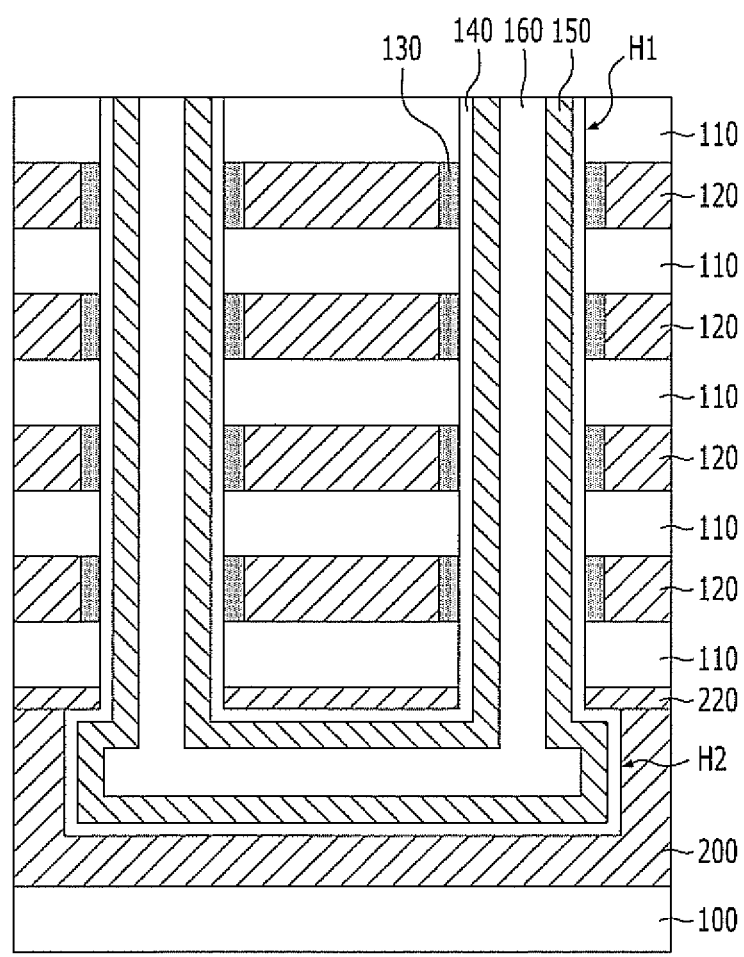

Referring to FIG. 2D, a memory layer 140 and a channel layer 150 are sequentially formed along the internal walls of the pair of channel holes H1 and the sub-channel holes H2.

The memory layer 140 may be formed by sequentially depositing a charge blocking layer, a charge storage layer, and a tunnel insulation layer, and it may have a triple layer structure of oxide-nitride-oxide (ONO). Meanwhile, the channel layer 150 may be divided into a main channel layer, that is used as a channel of a memory cell and a selection transistor, and a sub-channel layer, that is used as a channel of a pass transistor. The channel layer 150 may be formed of a semiconductor material, such as polysilicon.

Subsequently, the vacant space of the pair of channel holes H1 and the sub-channel holes H2 is filled with an insulation layer 160. The insulation layer 160 may be formed of an oxide-based material or a nitride-based material.

Figure 2E:
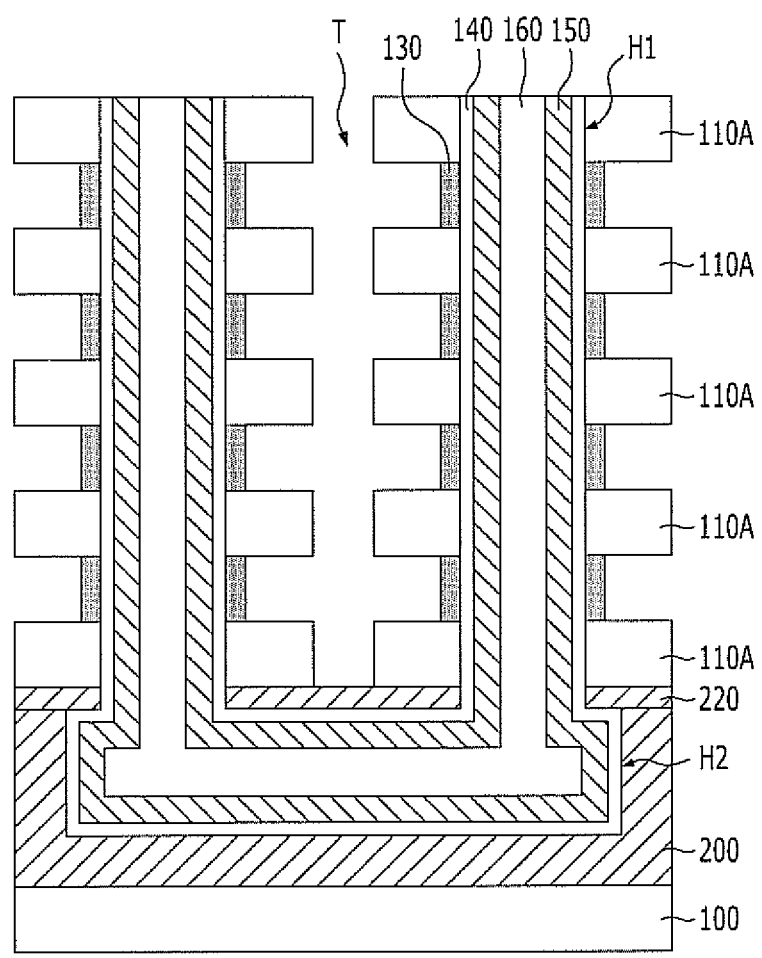

Referring to FIG. 2E, slit holes T penetrating through the inter-layer dielectric layer 110 and the sacrificial layers 120 on both sides of each channel hole H1 are formed. The slit holes T may be arrayed in parallel in a form of slits stretched in a direction crossing the cross-sectional direction of the drawing, and the remaining inter-layer dielectric layer 110 is referred to as an inter-layer dielectric layer pattern 110A.

Subsequently, the sacrificial layers 120 exposed through the slit holes T are removed. The sacrificial layers 120 may be removed through a wet etch process using phosphoric acid ($H_3PO_4$). In this process, the protective layer 130 protects the memory layer 140 from being damaged.

Figure 2F:
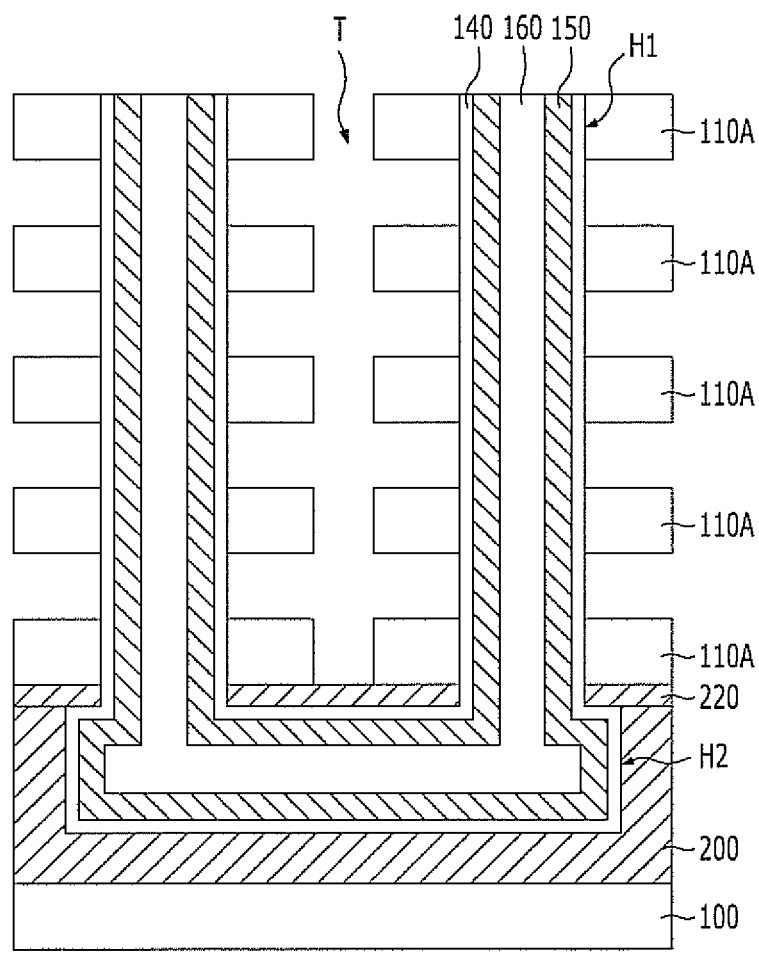

Referring to FIG. 2F, the protective layer 130 surrounding the memory layer 140 is removed. The protective layer 130 may be removed through a stripping process using nitric acid ($HNO_3$).

Subsequently, the charge blocking layer included in the memory layer 140 is densified. To densify the charge blocking layer, oxygen ($O_2$) plasma may be used. As a result of the process, the dangling bond of atoms inside the charge blocking layer are decreased to thereby improve the insulation characteristics of the charge blocking layer, and as a result, a back tunneling phenomenon of electrons may be prevented from occurring.

Figure 2G:
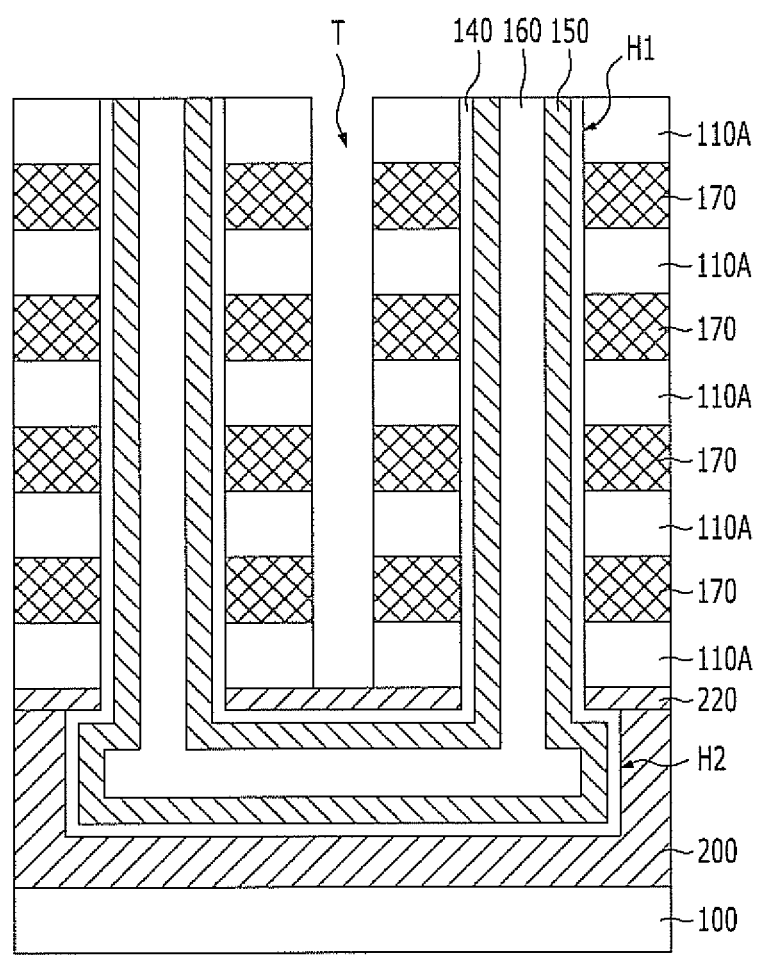

Referring to FIG. 2G, gate electrodes 170 are formed in the space from which the sacrificial layers 120 and the protective layer 130 are removed. The gate electrodes 170 may be formed by filling the space from which the sacrificial layers 120 and the protective layer 130 are removed with a conductive layer through a Chemical Vapor Deposition (CVD) or an Atomic Layer Deposition (ALD) process, and then performing an etch-back process until the sidewalls of the inter-layer dielectric layer pattern 110A are exposed.

According to an embodiment of the present invention, a method for fabricating a non-volatile memory device may protect a memory layer from being damaged in a process of removing a sacrificial layer to provide space where gate electrode layers are to be formed by interposing a protective layer between the sacrificial layer and the memory layer. Also, the non-volatile memory device fabrication method may prevent a back-tunneling phenomenon of electrons form being occurring by improving characteristics of a charge blocking layer included in the memory layer.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a non-volatile memory device, comprising:

forming a pass gate electrode layer surrounding a sacrificial layer pattern on a substrate;

alternately stacking a plurality of inter-layer dielectric layers and a plurality of sacrificial layers over the pass gate electrode layer;

forming at least a pair of channel holes that exposes the sacrificial layer pattern by selectively etching the inter-layer dielectric layers and the sacrificial layers;

removing the sacrificial layer pattern to form at least a sub-channel hole coupling the pair of the channel holes;

forming a protective layer on sidewalls of the sacrificial layers that are exposed through the channel holes;

sequentially forming a memory layer and a channel layer on the internal walls of the channel holes and the sub-channel hole;

forming slit holes that penetrate through the inter-layer dielectric layers and the sacrificial layers on the both sides of the channel holes;

removing the sacrificial layers that are exposed through the slit holes;

removing the protective layer; and forming gate electrodes in space from which the sacrificial layers and the protective layer are removed.

2. The method of claim 1, wherein the forming of the pass gate electrode layer comprises:

forming a first pass gate electrode layer on the substrate;

forming at least a groove by selectively etching the first pass gate electrode layer;

forming the sacrificial layer in the groove; and forming a second pass gate electrode layer over the first pass gate electrode layer and the sacrificial layer pattern.

3. The method of claim 1, wherein the sacrificial layer pattern is formed of a material having an etch selectivity from the inter-layer dielectric layers and the sacrificial layers.

4. The method of claim 1, wherein the protective layer is formed of a material having an etch selectivity from the sacrificial layers.

5. The method of claim 1, wherein the forming of the protective layer includes selectively depositing polysilicon.

6. The method of claim 1, wherein the forming of the protective layer comprises:

removing a portion of the sacrificial layers exposed through the channel hole; and forming the protective layer in space from which the portion of the sacrificial layers is removed.

7. The method of claim 1, wherein the inter-layer dielectric layers include oxide layers, and the sacrificial layers include nitride layers.

8. The method of claim 1, wherein the forming of the memory layer includes sequentially depositing a charge blocking layer, a charge storage layer, and a tunnel insulation layer.

9. The method of claim 8, further comprising:

densifying the charge blocking layer after the removing of the protective layer.

10. The method of claim 9, wherein the densifying of the charge blocking layer is performed using oxygen plasma.

11. The method of claim 1, further comprising:

forming a charge blocking layer by depositing aluminum oxide on internal wall of the space from which the sacrificial layers and the protective layer are removed after the removing of the protective layer.

* * * * *